US009297071B2

(12) United States Patent
Kanjolia et al.

(10) Patent No.: US 9,297,071 B2
(45) Date of Patent: Mar. 29, 2016

(54) SOLID PRECURSOR DELIVERY ASSEMBLIES AND RELATED METHODS

(75) Inventors: Ravi Kanjolia, North Andover, MA (US); Chris Platts, Littleton, MA (US); Nam Nguyen, Everett, MA (US); Mark Wilkinson, Lincoln, MA (US)

(73) Assignee: SIGMA-ALDRICH CO. LLC, St. Louis, MO (US)

( * ) Notice: Subject to any disclaimer, the term of this patent is extended or adjusted under 35 U.S.C. 154(b) by 779 days.

(21) Appl. No.: 13/504,838

(22) PCT Filed: Oct. 21, 2010

(86) PCT No.: PCT/US2010/053557
§ 371 (c)(1),
(2), (4) Date: Jul. 6, 2012

(87) PCT Pub. No.: WO2011/053505
PCT Pub. Date: May 5, 2011

(65) Prior Publication Data
US 2012/0266967 A1   Oct. 25, 2012

Related U.S. Application Data

(60) Provisional application No. 61/257,379, filed on Nov. 2, 2009.

(51) Int. Cl.
*C23C 14/24* (2006.01)
*C23C 16/448* (2006.01)

(52) U.S. Cl.
CPC ........... *C23C 16/4483* (2013.01); *C23C 14/243* (2013.01); *C23C 16/4481* (2013.01);
(Continued)

(58) Field of Classification Search
CPC   C23C 16/4483; C23C 16/243; C23C 14/243; Y10S 261/65; Y10T 137/4891; Y10T 137/7976; Y10T 137/8622; Y10T 137/8122

USPC .......... 137/268, 545, 574, 575, 576; 118/726; 34/587
See application file for complete search history.

(56) References Cited

U.S. PATENT DOCUMENTS

| 1,372,328 A | 3/1921 | Adams |
| 1,541,853 A | 6/1925 | Rottmann |

(Continued)

FOREIGN PATENT DOCUMENTS

| CN | 1250854 A | 4/2000 | ................ F16K 3/26 |
| CN | 1576667 A | 2/2005 | .............. F16K 11/08 |

(Continued)

OTHER PUBLICATIONS

Chinese Office Action dated Sep. 10, 2013 issued in Chinese Application No. 201080049353.0 with full English translation.

(Continued)

*Primary Examiner* — Atif Chaudry
(74) *Attorney, Agent, or Firm* — Harness, Dickey & Pierce, P.L.C.

(57) ABSTRACT

A solid precursor delivery assembly generally includes a container having upper and lower portions and chambers defined within the container, including an inlet chamber, an outlet chamber, and first and second precursor chambers. The first and second precursor chambers are configured for holding precursor material within the container. Sintered frits are fixedly coupled and sealed to an interior portion of the container, and define at least part of the chambers within the container. At least one of the sintered frits is configured for retaining precursor material thereon within the first precursor chamber, and at least one of the sintered frits is configured for retaining precursor material thereon within the second precursor chamber. An inlet is coupled to the container for delivering carrier gas into the container, and an outlet is coupled to the container for use in removing vaporized precursor material and carrier gas from the container.

21 Claims, 8 Drawing Sheets

(52) U.S. Cl.
CPC ...... *Y10T137/0318* (2015.04); *Y10T 137/4891* (2015.04); *Y10T 137/7976* (2015.04); *Y10T 137/8122* (2015.04); *Y10T 137/8622* (2015.04)

(56) References Cited

U.S. PATENT DOCUMENTS

| | | | |
|---|---|---|---|
| 2,032,095 A | 2/1936 | O'Leary | |
| 2,070,517 A | 2/1937 | O'Leary | |
| 2,076,262 A | 4/1937 | Black | |
| 2,504,009 A | 4/1950 | Phillips et al. | |
| 2,738,762 A | 3/1956 | Pawlyk | 118/49 |
| 3,230,245 A | 1/1966 | Binning et al. | 260/462 |
| 3,338,761 A | 8/1967 | Cheney et al. | 148/175 |
| 3,360,168 A | 12/1967 | Bret | 222/335 |
| 3,589,335 A | 6/1971 | Harthman et al. | 118/405 |
| 3,628,339 A | 12/1971 | Porter | 62/5 |
| 3,756,068 A | 9/1973 | Villarroel et al. | 73/23 |
| 3,831,069 A | 8/1974 | Merrell et al. | 317/246 |
| 3,884,819 A | 5/1975 | Schultz et al. | 250/533 |
| 3,935,740 A | 2/1976 | Whitney | 73/304 C |
| 4,010,650 A | 3/1977 | Piatkowski, Jr. | 73/304 C |
| 4,099,939 A | 7/1978 | Vancheri et al. | 55/246 |
| 4,140,735 A | 2/1979 | Schumacher | 261/22 |
| 4,191,541 A | 3/1980 | Jenkins | 55/18 |
| 4,211,748 A | 7/1980 | Vincent | 422/90 |
| 4,224,828 A | 9/1980 | Steinke | 73/421.5 R |
| 4,285,701 A | 8/1981 | Schlenker | 55/17 |
| 4,293,009 A | 10/1981 | Fulton | 141/311 |
| 4,298,037 A | 11/1981 | Schumacher et al. | 141/1 |
| 4,325,911 A | 4/1982 | Vincent | 422/75 |
| 4,448,072 A | 5/1984 | Tward | 73/304 C |
| 4,449,405 A | 5/1984 | Franz et al. | 73/304 C |
| 4,645,524 A | 2/1987 | Bocko et al. | 65/18.1 |
| 4,704,988 A | 11/1987 | Mellet | 118/726 |
| 4,805,675 A | 2/1989 | Joseph et al. | 141/302 |
| 4,809,129 A | 2/1989 | Hansen, III et al. | 361/284 |
| 4,859,375 A | 8/1989 | Lipisko et al. | 261/20 |
| 4,883,362 A | 11/1989 | Gärtner et al. | 366/101 |
| 4,886,178 A | 12/1989 | Graf | 215/247 |
| 4,915,880 A | 4/1990 | Jenkins | 261/124 |
| 4,919,304 A | 4/1990 | Markowicz | 222/3 |
| 4,947,790 A * | 8/1990 | Gartner et al. | 118/715 |
| 4,966,207 A | 10/1990 | Howard et al. | 141/98 |
| 5,019,423 A | 5/1991 | Hiai et al. | 427/248.1 |
| 5,031,068 A | 7/1991 | Hansen, III et al. | 361/284 |
| 5,078,922 A | 1/1992 | Collins et al. | 261/139 |
| 5,199,603 A | 4/1993 | Prescott | 222/3 |
| 5,217,904 A | 6/1993 | Bruno | 436/181 |
| 5,262,130 A | 11/1993 | Kissel et al. | 422/311 |
| 5,279,338 A | 1/1994 | Goossens | 141/1 |
| 5,336,473 A | 8/1994 | Nadler et al. | 422/193 |
| 5,397,467 A | 3/1995 | Morgan et al. | 210/198.2 |
| 5,535,923 A | 7/1996 | Fujioka | 222/148 |
| 5,553,395 A | 9/1996 | Wen et al. | 34/359 |
| 5,582,647 A | 12/1996 | Kato et al. | 118/715 |
| 5,603,169 A | 2/1997 | Kim | 34/587 |
| 5,607,581 A | 3/1997 | Gerner et al. | 210/198.2 |
| 5,653,813 A | 8/1997 | Benzing et al. | 118/726 |
| 5,662,838 A | 9/1997 | Yamaguchi et al. | 261/130 |
| 5,693,017 A | 12/1997 | Spears et al. | 604/132 |
| 5,701,084 A | 12/1997 | Borthwick, Jr. et al. | 324/690 |
| 5,749,500 A | 5/1998 | Kraus et al. | 222/377 |
| 5,755,885 A | 5/1998 | Mikoshiba et al. | 118/715 |
| 5,773,621 A | 6/1998 | Nisino et al. | 55/244 |
| 5,835,678 A | 11/1998 | Li et al. | 392/401 |
| 5,848,622 A | 12/1998 | Kilcoin | 141/59 |
| 5,878,793 A | 3/1999 | Siegele et al. | 141/63 |
| 5,961,360 A | 10/1999 | Nishimura et al. | 445/24 |
| 5,964,254 A | 10/1999 | Jackson | 141/1 |
| 5,992,830 A | 11/1999 | Daubs et al. | 261/121.1 |
| 6,008,421 A | 12/1999 | Larsen et al. | 570/255 |
| 6,029,717 A | 2/2000 | Siegele et al. | 141/198 |
| 6,032,724 A | 3/2000 | Hatta | 135/80.2 |
| 6,045,125 A | 4/2000 | Daubs et al. | 261/74 |
| 6,077,356 A | 6/2000 | Bouchard | 118/715 |
| 6,078,729 A | 6/2000 | Kopel | 392/402 |
| 6,101,816 A | 8/2000 | Wang et al. | 62/48.1 |
| 6,148,681 A | 11/2000 | Gravel et al. | 73/866.5 |
| 6,203,851 B1 | 3/2001 | Walter | 427/248.1 |
| 6,257,446 B1 | 7/2001 | Pike | 222/52 |
| 6,270,839 B1 | 8/2001 | Onoe et al. | 427/248.1 |
| 6,341,615 B1 | 1/2002 | Zorich et al. | 137/14 |
| 6,401,463 B1 | 6/2002 | Dukhan et al. | 62/5 |
| 6,435,224 B2 | 8/2002 | Blatt et al. | 141/21 |
| 6,444,038 B1 | 9/2002 | Rangarajan et al. | 118/715 |
| 6,475,291 B1 | 11/2002 | Petvai et al. | 134/3 |
| 6,599,484 B1 | 7/2003 | Zigler et al. | 422/130 |
| 6,607,785 B2 | 8/2003 | Timmons et al. | 427/248.1 |
| 6,637,212 B2 | 10/2003 | Torres et al. | 62/50.2 |
| 6,698,728 B1 | 3/2004 | Ravetz et al. | 261/121.1 |
| 6,718,126 B2 | 4/2004 | Lei | 392/388 |
| 6,874,770 B2 | 4/2005 | Torkaman | 261/130 |
| 6,905,541 B2 | 6/2005 | Chen et al. | 117/86 |
| 6,910,602 B2 | 6/2005 | Hasaka et al. | 222/3 |
| 6,921,062 B2 | 7/2005 | Gregg et al. | 261/23.1 |
| 6,962,624 B2 | 11/2005 | Jürgensen et al. | 117/99 |
| 6,978,984 B2 | 12/2005 | Kang et al. | 261/135 |
| 6,986,814 B2 | 1/2006 | Wheat et al. | 118/726 |
| 7,077,388 B2 | 7/2006 | Stamp et al. | 261/121.1 |
| 7,100,441 B2 | 9/2006 | Williams et al. | 73/304 C |
| 7,156,380 B2 | 1/2007 | Soininen | 261/122.1 |
| 7,186,385 B2 | 3/2007 | Ganguli et al. | 422/129 |
| 7,261,118 B2 | 8/2007 | Birtcher et al. | 137/13 |
| 7,278,438 B2 | 10/2007 | Scholz | 137/14 |
| 7,282,119 B2 | 10/2007 | Odedra et al. | 203/10 |
| 7,300,038 B2 | 11/2007 | Gregg et al. | 261/23.1 |
| 7,364,897 B2 | 4/2008 | Heaney et al. | 435/287.2 |
| 7,370,848 B2 | 5/2008 | Stamp et al. | 261/121.1 |
| 7,423,750 B2 | 9/2008 | Hoshizaki et al. | 356/317 |
| 7,429,361 B2 | 9/2008 | Ganguli et al. | 427/248.1 |
| 7,429,403 B2 | 9/2008 | Wheat et al. | 427/250 |
| 7,431,049 B2 | 10/2008 | Ricci et al. | 137/625.43 |
| 7,458,222 B2 | 12/2008 | Orr | 62/5 |
| 7,464,917 B2 | 12/2008 | Lee et al. | 261/121.1 |
| 7,487,956 B2 | 2/2009 | Gregg et al. | 261/142 |
| 7,497,420 B2 | 3/2009 | Soininen | 261/104 |
| 7,547,363 B2 | 6/2009 | Tomiyasu et al. | |
| 7,556,244 B2 | 7/2009 | Gregg et al. | 261/23.1 |
| 7,569,191 B2 | 8/2009 | Ganguli et al. | 427/255.394 |
| 7,601,225 B2 | 10/2009 | Tuominen et al. | 118/726 |
| 7,722,720 B2 | 5/2010 | Shenai-Khatkhate et al. | 118/726 |
| 7,828,274 B2 | 11/2010 | Gregg et al. | 261/142 |
| 7,829,032 B2 | 11/2010 | van Dam et al. | 422/159 |
| 8,221,852 B2 | 7/2012 | Heys et al. | |
| 8,272,626 B2 | 9/2012 | Cunning et al. | 261/122.1 |
| 2002/0078894 A1 | 6/2002 | Timmons et al. | 118/726 |
| 2003/0116019 A1 | 6/2003 | Torkaman | 95/226 |
| 2003/0116278 A1 | 6/2003 | Wheat et al. | 156/345.33 |
| 2004/0062865 A1 | 4/2004 | Wheat et al. | 427/248.1 |
| 2005/0008799 A1 | 1/2005 | Tomiyasu et al. | 428/34.1 |
| 2005/0072357 A1* | 4/2005 | Shero et al. | 118/715 |
| 2005/0227358 A1 | 10/2005 | McEntee et al. | 436/164 |
| 2005/0287298 A1 | 12/2005 | Wheat et al. | 427/248.1 |
| 2006/0037540 A1 | 2/2006 | Woelk et al. | 427/248.1 |
| 2006/0121198 A1 | 6/2006 | Shenai-Khatkhate et al. | 427/255.28 |
| 2006/0213446 A1 | 9/2006 | Atlas et al. | 118/715 |
| 2006/0213564 A1 | 9/2006 | Ricci et al. | 137/625.48 |
| 2006/0237861 A1 | 10/2006 | Stamp et al. | 261/121.1 |
| 2007/0079759 A1 | 4/2007 | Lee et al. | |
| 2007/0110898 A1 | 5/2007 | Ganguli et al. | 427/248.1 |
| 2007/0170604 A1 | 7/2007 | Soininen | 261/122.1 |
| 2007/0190684 A1 | 8/2007 | Jones | 427/255.32 |
| 2007/0221127 A1 | 9/2007 | Tran et al. | 392/386 |
| 2007/0240488 A1 | 10/2007 | Kreuser et al. | 73/19.07 |
| 2007/0266949 A1 | 11/2007 | Shenai-Khatkhate et al. | 427/248.1 |
| 2008/0014350 A1* | 1/2008 | Carlson et al. | 427/255.21 |
| 2008/0038163 A1 | 2/2008 | Boege et al. | 435/287.2 |
| 2008/0092816 A1 | 4/2008 | Birtcher et al. | 118/726 |
| 2008/0143002 A1 | 6/2008 | Steidl et al. | 261/122.1 |
| 2008/0191153 A1 | 8/2008 | Marganski et al. | 134/22.1 |
| 2008/0251016 A1 | 10/2008 | Cunning et al. | 118/722 |

(56) References Cited

U.S. PATENT DOCUMENTS

| | | | |
|---|---|---|---|
| 2008/0268143 A1 | 10/2008 | Vahlas et al. | 118/726 |
| 2009/0011129 A1 | 1/2009 | Ganguli et al. | 427/255.394 |
| 2009/0120364 A1 | 5/2009 | Suarez et al. | 118/715 |
| 2009/0133632 A1 | 5/2009 | Soininen | 261/104 |
| 2009/0136668 A1 | 5/2009 | Gregg et al. | 427/255.28 |
| 2009/0159003 A1* | 6/2009 | Noguchi et al. | 118/715 |
| 2009/0159715 A1 | 6/2009 | Lessig et al. | 236/1 |
| 2010/0009080 A1* | 1/2010 | Jan Snijders et al. | 427/255.28 |
| 2010/0117246 A1 | 5/2010 | Sarigiannis et al. | 261/22 |
| 2011/0174416 A1 | 7/2011 | Hubsch et al. | 141/1 |

FOREIGN PATENT DOCUMENTS

| | | | |
|---|---|---|---|
| CN | 1668899 A | 9/2005 | G01F 23/26 |
| CN | 1858470 A | 11/2006 | F16K 11/22 |
| CN | 101310042 A | 11/2008 | C23C 16/448 |
| DE | 3900069 | 9/1990 | C01B 17/027 |
| DE | 202004010834 | 9/2004 | F25B 9/04 |
| EP | 0288931 A2 | 11/1988 | F16K 11/10 |
| EP | 0420596 A1 | 4/1991 | C23C 16/44 |
| EP | 0482878 A2 | 4/1992 | B01D 1/14 |
| EP | 0650048 A1 | 4/1995 | G01N 27/22 |
| EP | 0696472 A1 | 2/1996 | B01J 4/00 |
| EP | 0931861 A | 7/1999 | C30B 25/14 |
| EP | 1006219 A1 | 6/2000 | C30B 25/14 |
| EP | 1160355 | 10/2004 | C23C 16/448 |
| GB | 9516 | 0/1905 | |
| GB | 2081450 A | 2/1982 | G01F 23/26 |
| GB | 2212272 A | 7/1989 | G01F 23/26 |
| GB | 2328625 A | 3/1999 | B01D 1/00 |
| GB | 2390905 A | 1/2004 | G01F 23/26 |
| GB | 2432371 | 5/2007 | C23C 16/448 |
| JP | 60070176 | 4/1985 | |
| JP | 60-131973 | 7/1985 | C23C 16/50 |
| JP | 1-1266801 A | 10/1989 | |
| JP | 2048001 | 2/1990 | B01D 1/16 |
| JP | 02-69389 | 3/1990 | C30B 25/14 |
| JP | 2-172889 | 7/1990 | |
| JP | 02172889 A * | 7/1990 | C30B 25/14 |
| JP | 3031477 | 2/1991 | C23C 16/44 |
| JP | 3075295 | 3/1991 | C30B 25/14 |
| JP | 03-131018 A | 6/1991 | |
| JP | 7278818 | 10/1995 | C23C 16/44 |
| JP | 08279497 | 10/1996 | H01L 21/31 |
| JP | 09-040489 | 2/1997 | |
| JP | 10-223540 | 8/1998 | |
| JP | 2000-128181 | 5/2000 | B65G 25/56 |
| JP | 2002-83777 | 3/2002 | |
| JP | 2005-033045 A | 2/2005 | |
| JP | 2003-273093 | 9/2006 | |
| JP | 2009051607 | 3/2009 | C23C 16/448 |
| JP | 2010032535 | 2/2010 | G01F 3/22 |
| KR | 10200536951 A | 4/2005 | G01F 23/26 |
| KR | 1020067015779 | 12/2006 | F16K 31/122 |
| RU | 2045999 | 7/1992 | B01D 47/02 |
| RU | 2274483 | 4/2006 | B01D 53/14 |
| SU | 1126315 | 5/1983 | B01F 3/04 |
| SU | 1669524 | 7/1989 | B01F 7/26 |
| TW | 200401883 | 2/2004 | G01F 23/26 |
| TW | 200719949 | 6/2007 | C23C 16/448 |
| TW | 200912030 A | 3/2009 | |
| WO | WO 98/27247 | 6/1998 | C23C 16/00 |
| WO | WO 00/07954 | 2/2000 | C03C 17/245 |
| WO | WO 01/29491 | 4/2001 | F25B 9/04 |
| WO | WO 01/42539 | 6/2001 | C23C 16/448 |
| WO | WO 02/07848 | 1/2002 | B01D 3/00 |
| WO | WO 02/33143 | 4/2002 | C23C 16/00 |
| WO | WO 2004/007793 | 1/2004 | C23C 16/00 |
| WO | WO 2004/008085 | 1/2004 | G01F 23/26 |
| WO | WO 2005/066535 | 7/2005 | F16L 39/00 |
| WO | WO 2005/113857 | 12/2005 | C23C 16/448 |
| WO | WO 2005/118119 | 12/2005 | B01F 3/04 |
| WO | WO 2006/104992 | 10/2006 | F16K 11/07 |
| WO | WO 2007/010810 | 1/2007 | B28D 5/00 |
| WO | WO 2007/057631 | 5/2007 | C23C 16/448 |
| WO | WO 2007/121202 | 10/2007 | C23C 16/448 |
| WO | WO-2007/139159 A1 | 12/2007 | |
| WO | WO 2010/021891 | 2/2010 | F16K 11/22 |
| WO | WO 2011/053505 | 5/2011 | C23C 16/448 |
| WO | WO 2011/097100 | 8/2011 | B01B 1/00 |
| WO | WO 2011/112413 | 9/2011 | C23C 16/00 |

OTHER PUBLICATIONS

European Office Action dated Sep. 26, 2013 issued in European Application No. 10 775 984.7.
Eisch (1962), "Organometallic Compounds of group III. I . The preparation of gallium and indium alkyls from organoaluminum compounds", *J. Am. Chem. Soc.*, 84(19):3605-3609.
Epichem Group e-news, Jun. 20, 2008, p. 1.
Epichem group news, Teamwork Award, 2006, p. 1-12.
Insight, SAFC Expansion in Far East, Apr. 2008, p. 1-17.
International Search Report and Written Opinion in PCT/GB00/02559, published WO 01/042539, dated Oct. 19, 2000.
International Preliminary Examination Report in PCT/GB00/02559, published WO 01/042539, dated Nov. 8, 2001.
International Search Report in PCT/GB01/00906, published WO 02/07848, dated May 31, 2001.
International Preliminary Examination Report in PCT/GB01/00906, published WO 02/07848, dated Nov. 6, 2002.
International Search Report and Written Opinion in PCT/GB03/02761, published WO 04/008085, dated Nov. 10, 2003.
International Preliminary Examination Report in PCT/GB03/02761, published WO 04/008085, dated Jun. 15, 2004.
International Preliminary Report on Patentability for PCT/GB2006/003801, published as WO 07/057631, issued on Feb. 29, 2008.
International Search Report and Written Opinion for PCT/GB2006/003801, published as WO 07/057631, issued on Jan. 15, 2007.
International Search Report and Written Opinion in PCT/US2009/053587, published WO/2010/021891, dated Nov. 18, 2009.
International Preliminary Report on Patentability in PCT/U82009/053587, published WO 10/021891, dated Mar. 3, 2011.
International Search Report and Written Opinion in PCT/US2010/053557, published WO/2011/053505, dated Jan. 27, 2011.
International Preliminary Report on Patentability in PCT/US2010/053557, published WO/2011/053505, dated May 8, 2012.
Mohl K-D, et al. (1998), "Mehrfache stationäre Betriebszustände bei der Herstellung des Kraftstoffethers TAME durch Reaktivrektifikation—Teil 1: Theoretische Analyse" ["Multiple stationary operating states in the production of the fuel ether TAME by reactive rectification—Part 1 : Theoretical analysis"], *Chemie Ingenieur Technik*, 70(5):524-527.
Smith L M et al., *Trimethylindium Transport Studies: The Effect of Different Bubbler Designs*, Journal of Crystal Growth. 272:(1-4) 37-41 (2004 ).
"Vortex heating and cooling using air pressure" available at http://www.icestuff.com/~energy21/vortex.htm (accessed Sep. 12, 2009).
English Language Abstract of RU 2151970, Vortex Tube With Internal Regeneration of Heat, Jun. 27, 2000.

* cited by examiner

SOLID PRECURSOR DELIVERY ASSEMBLIES AND RELATED METHODS

CROSS-REFERENCE TO RELATED APPLICATIONS

This patent application is a U.S. national stage filing under 35 U.S.C. 371 of International Application No. PCT/US2010/053557, which was filed on 21 Oct. 2010, and which published as WO 2011/053505 on 5 May 2011, and which claims the benefit of U.S. provisional application Ser. No. 61/257,379, filed on 2 Nov. 2009. The entire disclosures of each of the above applications are incorporated herein by reference.

FIELD

The present disclosure generally relates to solid precursor delivery assemblies, and more particularly to solid precursor delivery assemblies having divided chambers for use in improving carrier gas saturation within the solid precursor delivery assemblies, and related methods.

BACKGROUND

This section provides background information related to the present disclosure which is not necessarily prior art.

In the semiconductor industry, electronic devices are often produced by means of a deposition process (e.g., chemical vapor deposition (CVD), atomic layer deposition (ALD), etc.). Typically, a liquid or solid precursor is supplied, for example, in a container through which a carrier gas, such as nitrogen or hydrogen, may be moved via a dip pipe so that the gas becomes saturated with the precursor. The carrier gas/precursor vapor mixture is then passed at a controlled rate into an epitaxial reactor. Such systems are used in the production of both silicon and compound semiconductors. It is important that the concentration of the chemical in the vapor phase be extremely stable. Channeling and non-uniform surfaces provided by conventional single-use type systems can lead to variable vaporization of the precursors, causing fluctuations in the gas/precursor concentrations. Such fluctuations are adverse to the deposition process. This is particularly noticeable with solid precursors, such as trimethylindium (TMI).

In metalorganic chemical vapor deposition (MOCVD) systems, a steady, controllable flux of precursor into the reaction chamber is important when fabricating highly complex device structures. Typically, simple delivery system designs are employed to perform this task with the carrier gas flow and source temperature control being able to provide a suitably stable system. However, increasing volume demands, for example, placed on MOCVD equipment have necessitated increased flows and/or larger systems. These typical delivery system designs are no longer suitable to meet these requirements.

SUMMARY

This section provides a general summary of the disclosure, and is not a comprehensive disclosure of its full scope or all of its features.

Example embodiments of the present disclosure generally relate to solid precursor delivery assemblies. In one example embodiment, a solid precursor delivery assembly generally includes a container, at least two chambers defined within the container and configured to hold precursor material within each of the respective at least two chambers, at least two porous dividers fixedly coupled to the container and defining at least part of the at least two chambers configured to hold precursor material, an inlet coupled to the container for delivering carrier gas into the container, and an outlet coupled to the container for removing vapor product from the container comprising vaporized precursor material and carrier gas.

In another example embodiment, a solid precursor delivery assembly generally includes a container having upper and lower portions. Four chambers are defined within the container, including an inlet chamber, an outlet chamber, and first and second precursor chambers. The first and second precursor chambers are configured for holding precursor material within the container. Three sintered frits are fixedly coupled and sealed to an interior portion of the container. The three sintered frits define at least part of the four chambers within the container. At least one of the sintered frits is configured for retaining precursor material thereon within the first precursor chamber, and at least one of the sintered frits is configured for retaining precursor material thereon within the second precursor chamber. An inlet is coupled to the upper portion of the container for delivering carrier gas into the container. An outlet is coupled to the lower portion of the container for use in removing vapor product from the container comprising vaporized precursor material and carrier gas.

Example embodiments of the present disclosure generally relate to methods of recovering vaporized precursor material with carrier gas in multi-chamber solid precursor delivery assemblies. One example method generally includes delivering carrier gas to a multi-chamber solid precursor delivery assembly and retaining carrier gas within headspace of a first precursor chamber of the multi-chamber solid precursor delivery assembly generally above precursor material disposed within the first precursor chamber until a desired pressure differential exists across a first sintered frit of the multi-chamber solid precursor delivery assembly separating the first precursor chamber from a second precursor chamber, at which time the carrier gas and vaporized precursor material recovered by the carrier gas flows through the first sintered frit to the second precursor chamber. The example method also generally includes retaining the carrier gas within headspace of the second precursor chamber of the multi-chamber solid precursor delivery assembly generally above precursor material disposed within the second precursor chamber until a desired pressure differential exists across a second sintered frit of the multi-chamber solid precursor delivery assembly separating the second precursor chamber from a third chamber, at which time the carrier gas and vaporized precursor material recovered by the carrier gas flows through the second sintered frit to the third chamber, and removing the carrier gas and vaporized precursor material recovered by the carrier gas from the multi-chamber solid precursor delivery assembly.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 1:
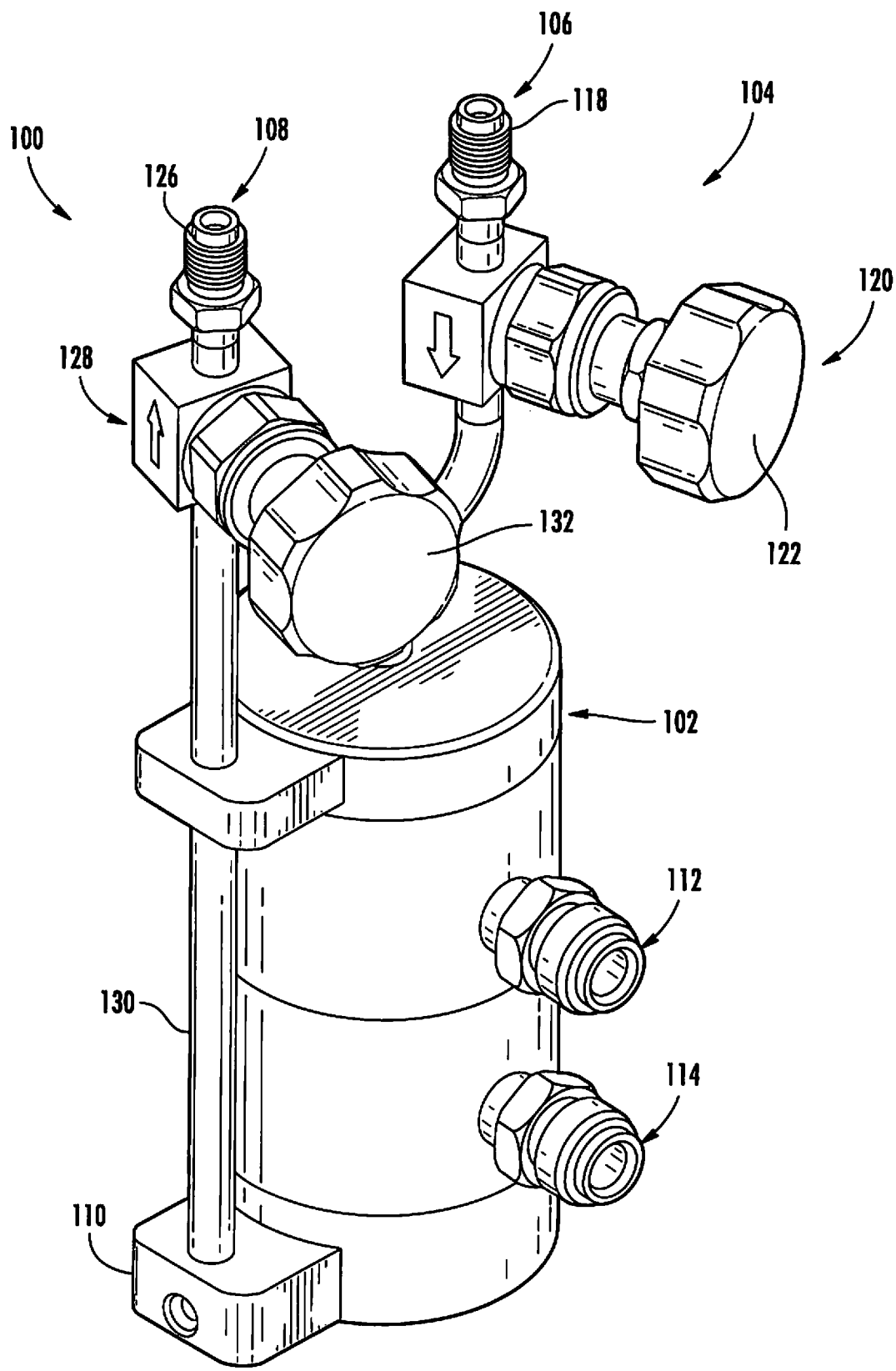
FIG. 1 is a perspective view of an example embodiment of a solid precursor delivery assembly including one or more aspects of the present disclosure.
Figure 7:
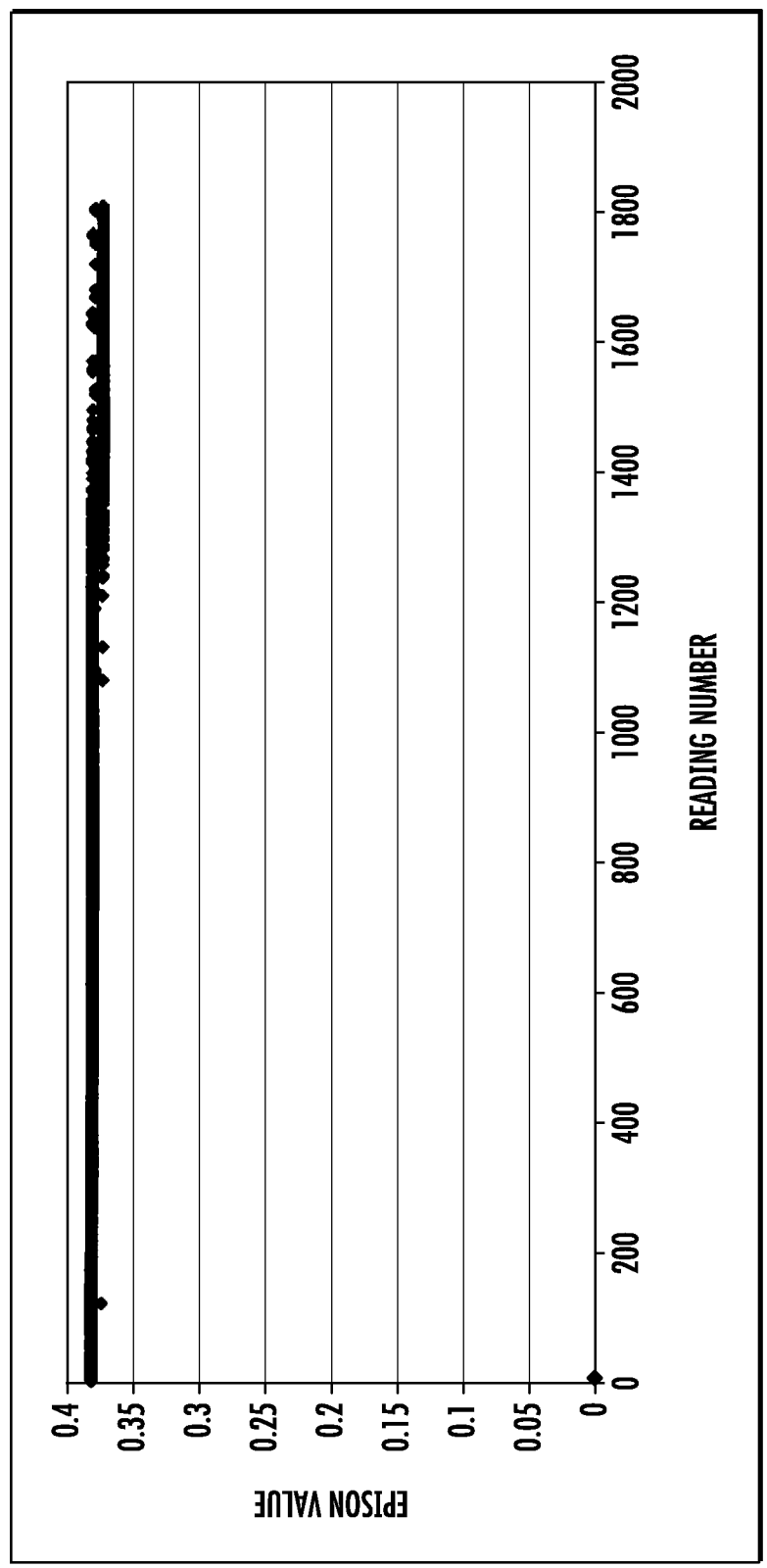
Figure 8:
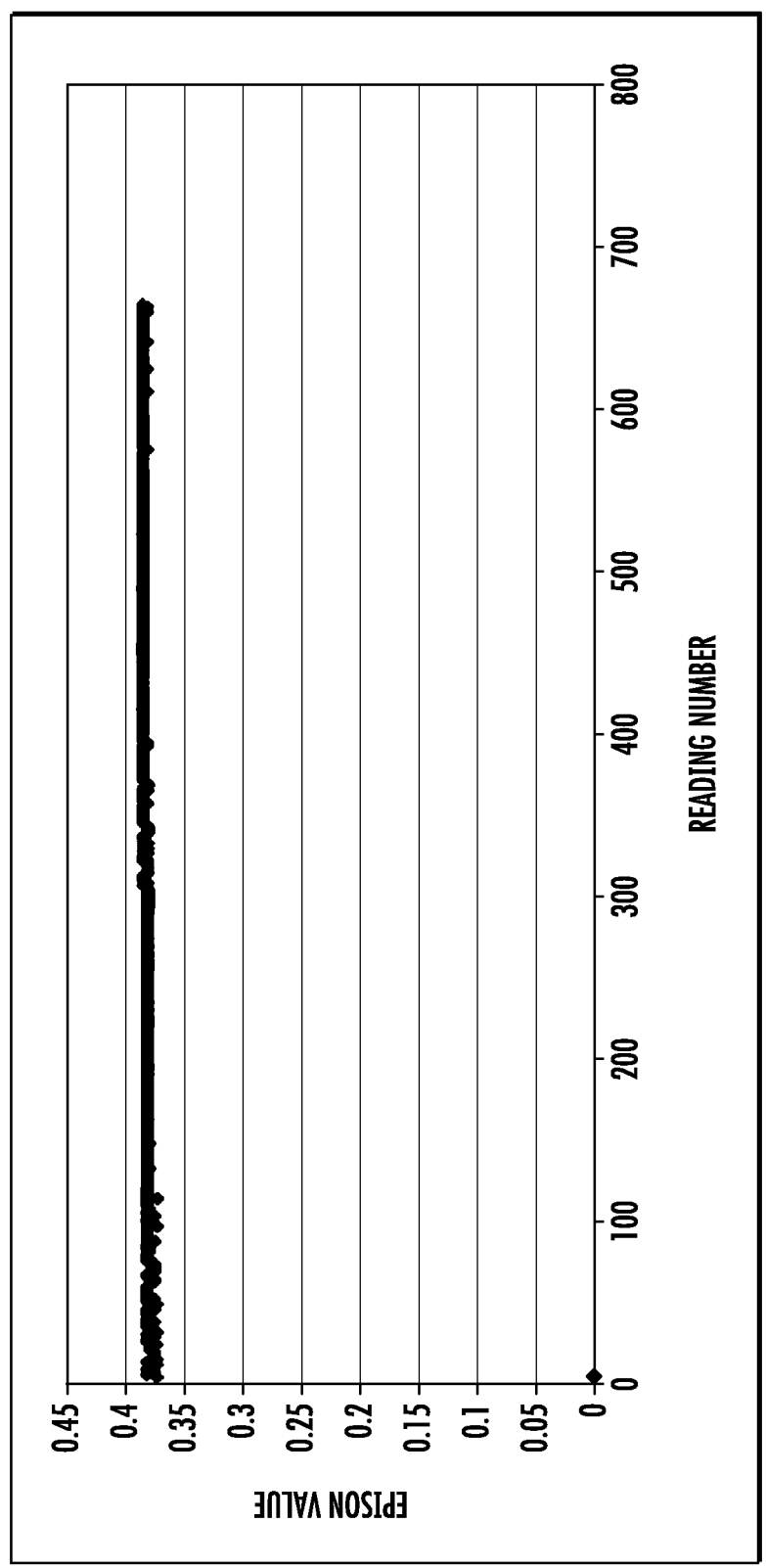

FIG. 7 is an Epison graph illustrating a delivery concentration percentage profile of trimethylindium (TMI) from the example solid precursor delivery assembly of FIG. 1 during an example operation of the assembly; and FIG. 8 is an Epison graph illustrating a delivery concentration percentage profile of TMI from the example solid precursor delivery assembly of FIG. 1 during another example operation of the assembly.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

With reference now to the drawings, FIGS. 1-5 illustrate an example embodiment of a solid precursor delivery assembly 100 (e.g., a bubbler assembly, etc.) including one or more aspects of the present disclosure. The example assembly 100 is configured (e.g., sized, shaped, constructed, etc.) to, among other things, deliver precursor material disposed within the assembly 100 to a reactor site, in gas phase, for subsequent use at the reactor site (e.g., via a carrier gas for subsequent use in a vapor deposition process, etc.). It should be noted that the example assembly 100 may be used with any solid precursor material (e.g. trimethylindium (TMI), bis(cyclopentadienyl) magnesium ($MgCp_2$), pentakis(dimethylamino)tantalum (PDMAT), Metal beta-Diketonates ($M(THD)_n$ where M may include rare earth elements, Yttrium (Y), Barium (Ba), etc.; THD is tetramethylheptanedionate; and n may be 3 or 4), Metal halides ($MX_4$ where M may include Hafnium (Hf), Zirconium (Zr), etc. and X may include Chlorine (Cl), Bromine (Br), Iodine (I), etc.), Metal cyclopentadienyls (($R_n Cp_{5-n}$)$_2$M where R may include methyl groups, ethyl groups, isopropyl groups, tertiarybutyl groups, etc.; M may include Barium (Ba), Strontium (Sr), etc.; and n is 1-3), Metal carbonyls (e.g., $Ru3(CO)_{12}$, $W(CO)_6$, etc.) etc.) within the scope of the present disclosure. In addition, any suitable carrier gas may be used with the example assembly 100, including, for example, nitrogen gas, hydrogen gas, argon gas, carbon monoxide, etc.

Figure 2:
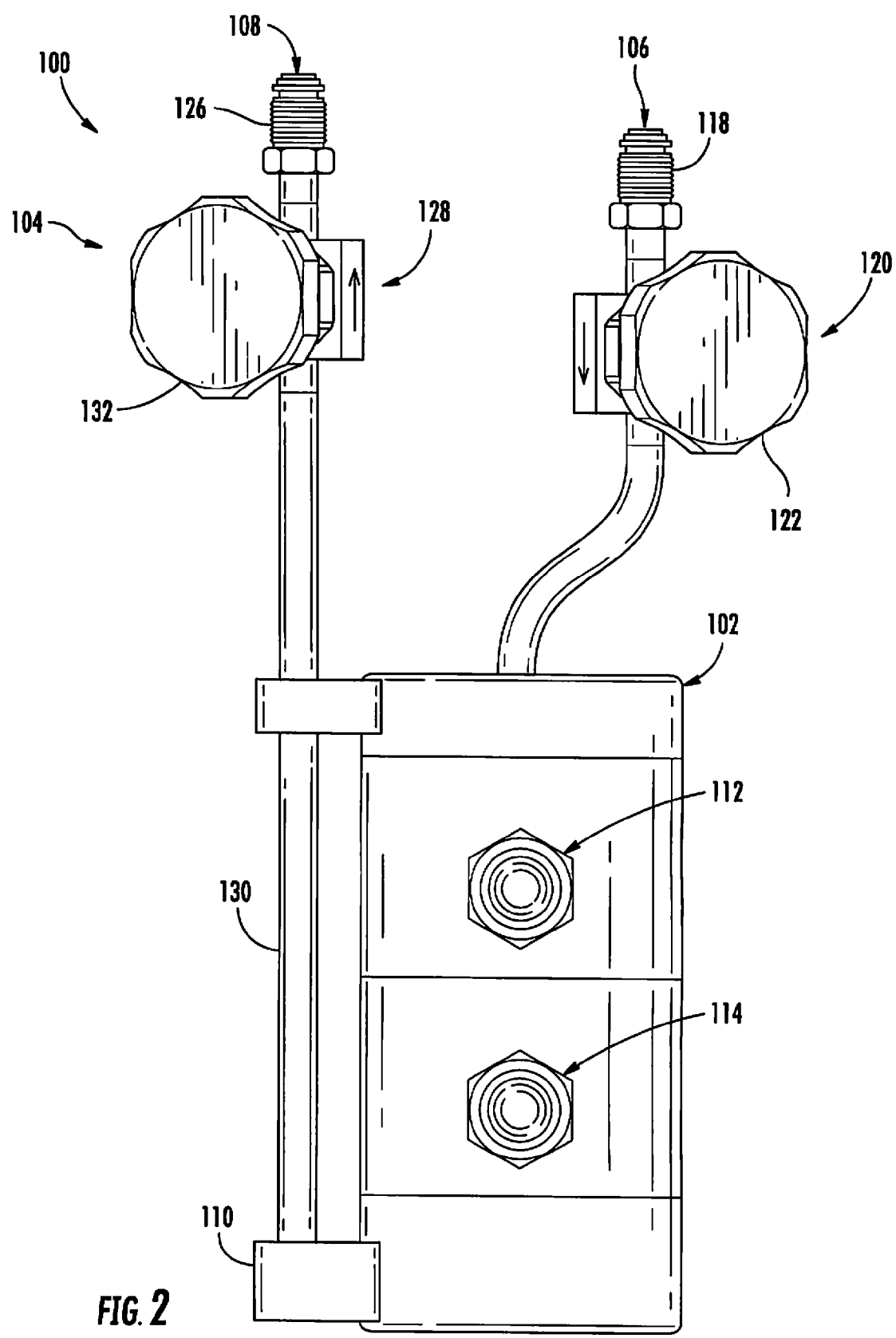
FIG. 2 is a forward elevation view of the solid precursor delivery assembly of FIG. 1.
Figure 3:
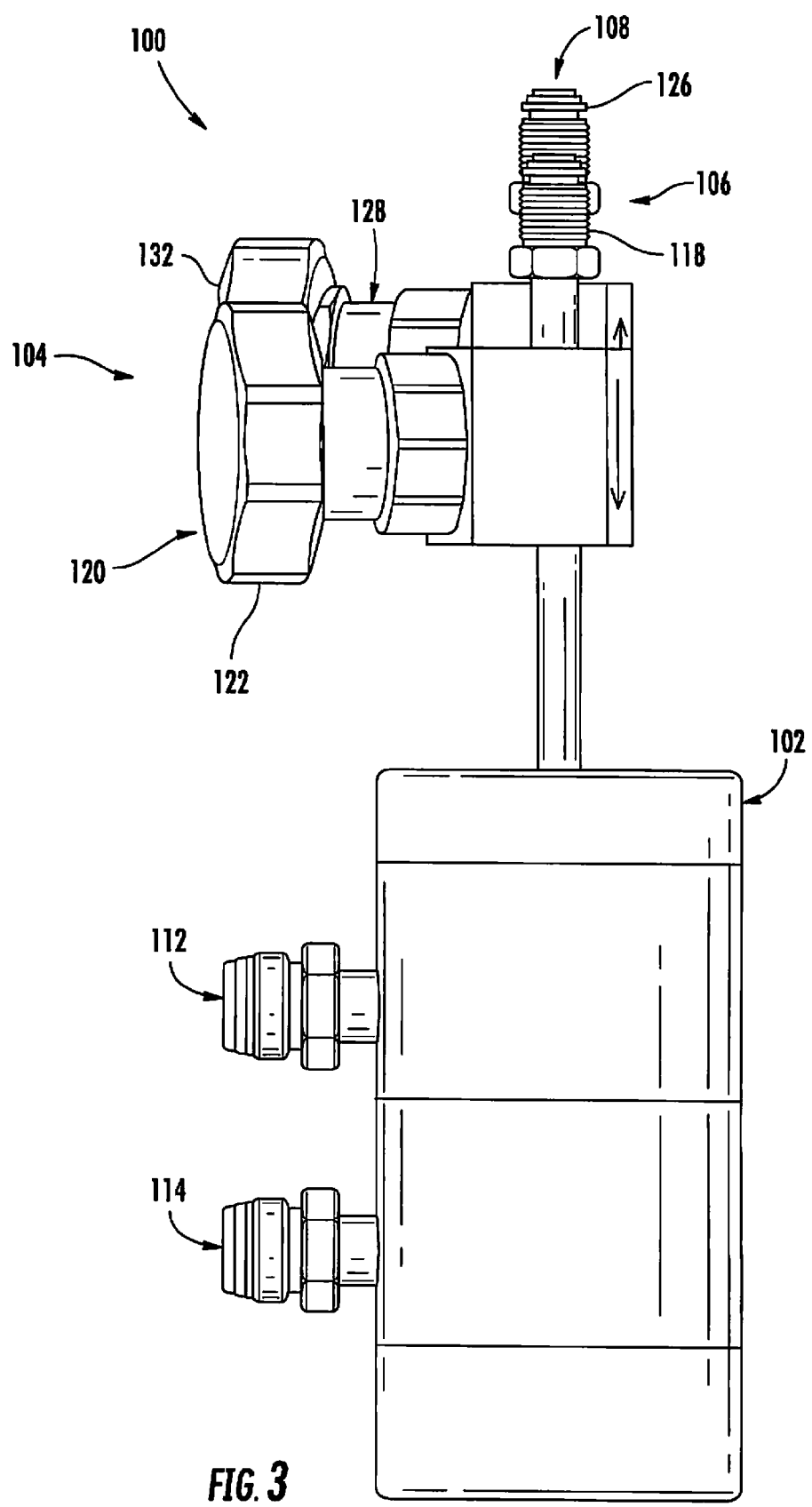
FIG. 3 is a side elevation view of the solid precursor delivery assembly of FIG. 1.

As shown in FIGS. 1-3, the example solid precursor delivery assembly 100 generally includes a cylindrical container 102 for holding precursor material (and vaporized precursor material), and a valve assembly 104 for controlling, for example, carrier gas flow into the container 102 and vapor product (comprising carrier gas and vaporized precursor material) flow out of the container 102, etc. The container 102 can be formed as a generally substantially sealed structure, for example, to inhibit undesired flow of precursor material, vaporized precursor material, carrier gas, vapor product, etc. out of the container 102 and/or to inhibit undesired flow of contaminants, etc. into the container 102. The container 102 can be formed from any suitable material within the scope of the present disclosure including, for example, inert materials such as glass, stainless steel, etc. In other example embodiments, containers may have shapes other than cylindrical within the scope of the present disclosure.

The valve assembly 104 of the illustrated solid precursor delivery assembly 100 generally includes an inlet 106 and an outlet 108. The inlet 106 is configured to introduce (or deliver, or dispense, etc.) carrier gas into the container 102, and the outlet 108 is configured to transport (or remove) vaporized precursor material retrieved from the precursor material by the carrier gas out of the container 102. In the illustrated embodiment, the inlet 106 is coupled to an upper portion of the container 102 by a suitable coupling, connection, etc. (e.g., a threaded coupling, etc.). The outlet 108 is coupled to a lower portion of the container 102 by a fluid connector 110. As such, the inlet 106 and the outlet 108 are each in fluid communication with the container 102. Carrier gas can thus generally flow from the inlet 106, through the container 102, and to the outlet 108 as desired (e.g., from the upper portion of the container 102 to the lower portion of the container 102, etc.). In other example embodiments, solid precursor delivery assemblies may include inlets coupled to lower portions of containers and outlets coupled to upper portions of the containers such that carrier gas flows generally upwardly through the containers (e.g., from the lower portions of the containers to the upper portions of the containers, etc.).

With continued reference to FIGS. 1-3, first and second fill ports 112 and 114 are positioned along an outer surface portion of the container 102 for use in filling and/or refilling the container 102 as necessary, for example, with precursor material. The fill ports 112 and 114 are each coupled to the container 102 by a suitable coupling, connection, etc. such that the fill ports 112 and 114 are each in fluid communication with the container 102. In normal use, the fill ports 112 and 114 may be capped with an appropriate fitting, connector, etc. to help generally seal the container 102 and help ensure that carrier gas flow through the container 102 is from the inlet 106 to the outlet 108 via desired pathways.

Figure 4:
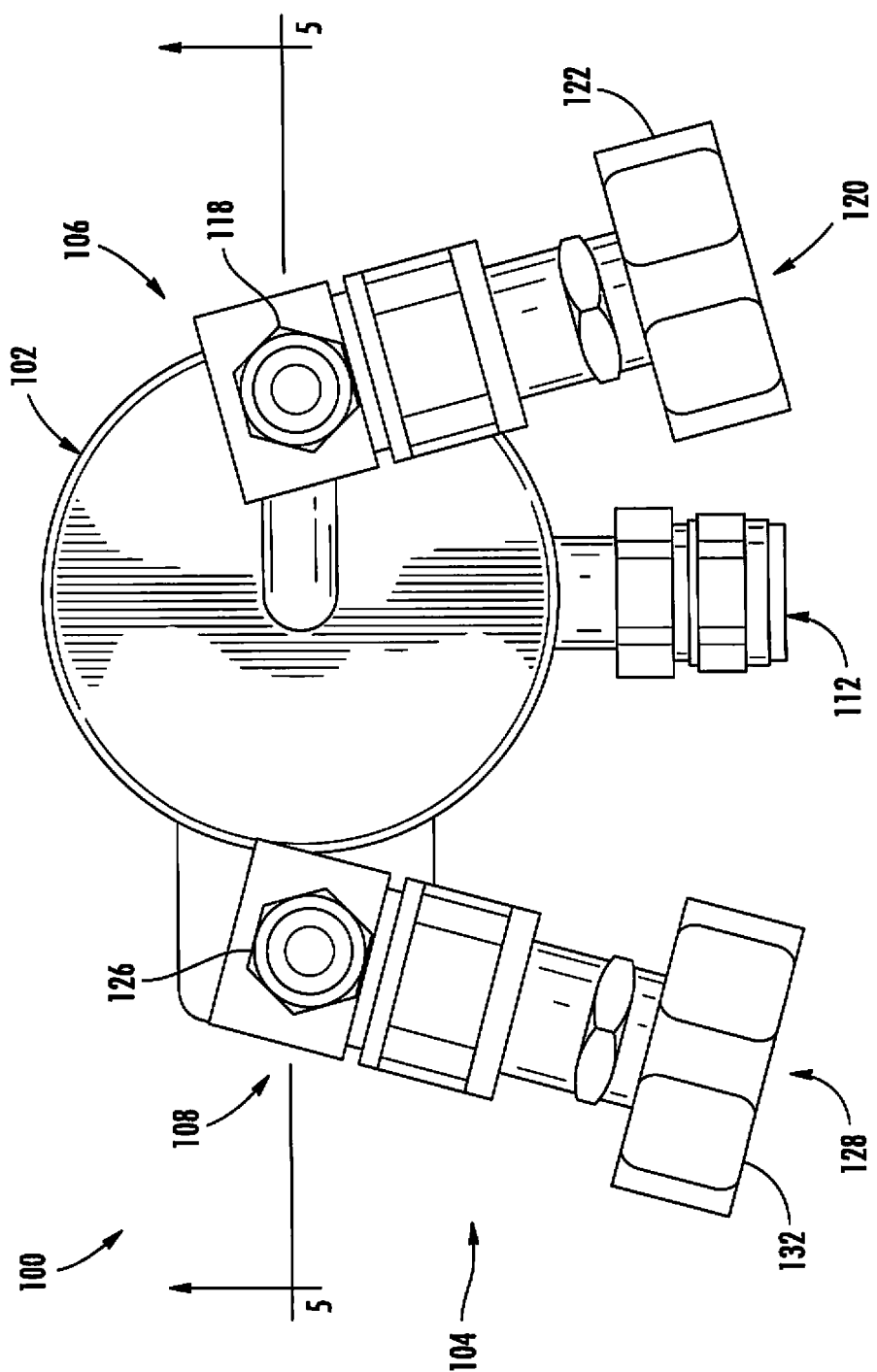
FIG. 4 is an upper plan view of the solid precursor delivery assembly of FIG. 1.

With additional reference to FIG. 4, the inlet 106 generally includes a coupling 118 and a valve structure 120. The coupling 118 is configured to couple (e.g., via a threaded connection, etc.) the inlet 106 to a carrier gas supply line (not shown) for supplying carrier gas to the inlet 106. The valve structure 120 is configured to control the flow of carrier gas into the container 102 through the inlet 106. An actuator 122 of the valve structure 120 can be operated to selectively open a valve spool (not shown) to allow the carrier gas to flow into the container 102, and to selectively close the valve spool (not shown) to inhibit the carrier gas from flowing into the container 102.

Similarly, the outlet 108 generally includes a coupling 126 and a valve structure 128. The coupling 126 is configured to couple (e.g., via a threaded connection, etc.) the outlet 108 to a product transfer line (not shown) for receiving vapor product out of the container 102 (e.g., by drawing a vacuum through the product transfer line, etc.). The valve structure 128 is configured to control the flow of vapor product out of the container 102 through the outlet 108. The outlet 108 also includes an exterior tube 130 extending from the valve structure 128 to the fluid connector 110, substantially along a height (or length) dimension of (and spaced apart from) the container 102. The exterior tube 130 may be coupled to the fluid connector 110 by a suitable coupling, connector, etc. (e.g., a threaded coupling, etc.). An actuator 132 of the valve structure 128 can be operated to selectively open a valve spool (not shown) to allow the vapor product to flow out of the container 102 (e.g., through the fluid connector 110 and the exterior tube 130 to the product transfer line, etc.), and to selectively close the valve spool (not shown) to inhibit the vapor product from flowing out of the container 102. In other example embodiments, solid precursor delivery assemblies may include outlets having interior tubes disposed substantially within containers and coupled to the containers at lower portions thereof for use in removing vapor product out of the containers.

Figure 5:
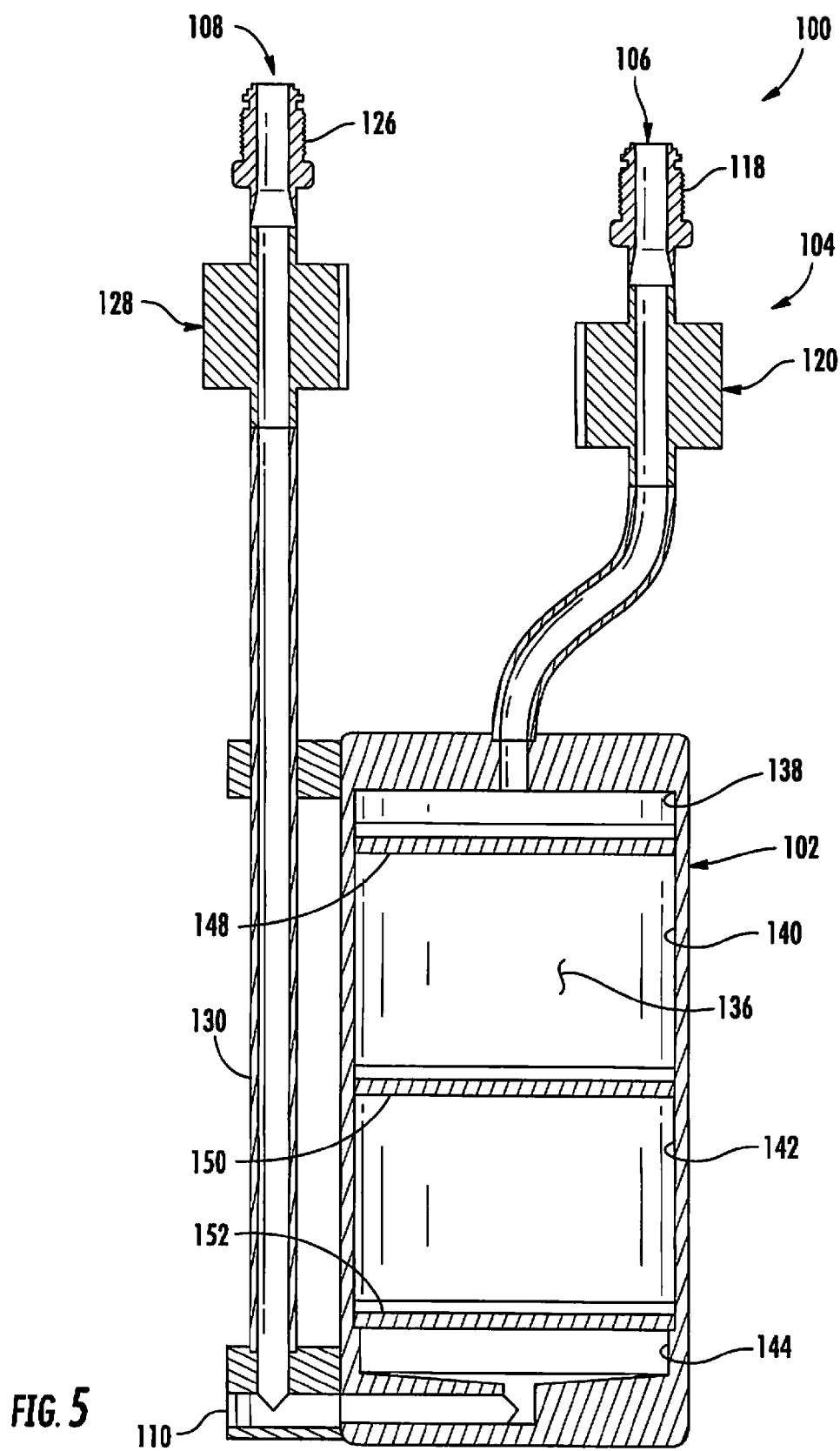
FIG. 5 is a section view of the solid precursor delivery assembly of FIG. 1 taken in a plane including line 5-5 in FIG. 4.

With reference now to FIG. 5, the container 102 of the illustrated solid precursor delivery assembly 100 includes a uniform, generally cylindrical interior space 136 defined therein. In other example embodiments, containers may have interior spaces having shapes other than cylindrical within the scope of the present disclosure.

The interior space 136 of the container 102 is divided into four chambers 138, 140, 142, and 144 (oriented generally in series) by three porous distributor plates 148, 150, and 152 (broadly, porous dividers). In the illustrated embodiment, the four chambers generally include an inlet chamber 138, first and second precursor chambers 140 and 142, and an outlet chamber 144. The inlet chamber 138 is generally configured to receive carrier gas into the container 102 from the inlet 106 and is located toward the upper portion of the container 102, adjacent where the inlet 106 introduces carrier gas into the container 102. The outlet chamber 144 is generally configured to transition carrier gas (and vaporized precursor materials recovered by the carrier gas) from the container 102 to the outlet 108 and is located toward the lower portion of the container 102, adjacent where the outlet 108 removes carrier gas from the container 102. The first and second precursor chambers 140 and 142 are each configured to hold precursor material within each of the respective chambers 140 and 142. The chambers 138, 140, 142, and 144 may have any desired shape, size, etc. within the scope of the present disclosure.

As viewed in FIG. 5, a first distributor plate 148 is located toward the upper portion of the container 102; a second distributor plate 150 is located generally below the first distributor plate 148 toward a middle portion of the container 102; and a third distributor plate 152 is located generally below the second distributor plate 150 toward a lower portion of the container 102. The inlet chamber 138 is defined toward the upper portion of the container 102 generally above the first distributor plate 148; the first precursor chamber 140 is defined generally between the first distributor plate 148 and the second distributor plate 150; the second precursor chamber 142 is defined generally between the second distributor plate 150 and the third distributor plate 152; and the outlet chamber 144 is defined toward the lower portion of the container 102 generally below the third distributor plate 152.

The distributor plates 148, 150, and 152 are each fixedly coupled (and generally sealed) to an interior surface portion of the container 102 so as to inhibit flow of the carrier gas and vapor product around peripheral edges of the distributor plates 148, 150, and 152 (e.g., between the peripheral edges of the distributor plates 148, 150, and 152 and the interior surface portion of the container 102, etc). For example, the distributor plates 148, 150, and 152 may be welded to the interior surface portion of the container 102, mechanically fastened and sealed to the interior surface portion of the container 102, otherwise sealed to the interior surface portion of the container 102, etc. As such, the distributor plates help at least partially define a generally fixed size, volume, etc. for each of the respective chambers 138, 140, 142, and 144. In the illustrated embodiment, the size, volume, etc. of chambers 138 and 144 is about the same, and the size, volume, etc. of chambers 140 and 142 is about the same. In other example embodiments, solid precursor delivery assemblies may have chambers that all have similar sizes, volumes, etc., or chambers that all have different sizes, volumes, etc. This will be described in more detail hereinafter.

The distributor plates 148, 150, and 152 are each generally configured to create a pressure differential within the container 102 between adjacent chambers 138, 140, 142, and 144. The distributor plates 148, 150, and 152 accomplish this by generally resisting flow of carrier gas and/or vaporized precursor material therethrough. As such, the distributor plates 148, 150, and 152 effectively control flow of the carrier gas and/or vaporized precursor material through the container 102, and can help provide good distribution of carrier gas through the container 102.

In the illustrated embodiment, for example, the distributor plates 148, 150, and 152 may be generally configured to create a pressure differential of about five thousand Pascals. The pressure differential across each of the distributor plates 148, 150, and 152 should be significantly larger than the pressure drop across the precursor material, if any, in the respective chamber 138, 140, 142, or 144 immediately upstream of the given distributor plate 148, 150, or 152, for example about ten times larger than the pressure drop across said precursor material, and as large a fraction as practicable of the average pressure in the chamber 138, 140, 142, or 144 upstream of the given distributor plate 148, 150, or 152, for example about 0.5 percent to about 50 percent of said pressure. These numerical values are provided as examples, and do not limit the scope of the present disclosure.

Any suitable distributor plates may be used with the solid precursor delivery assembly 100. For example, distributor plates having a desired nominal pore sizes (e.g., distributor plates with nominal pore sizes of about 0.5 microns, etc.) may be used; distributor plates having a desired resistance to gas flow (e.g., greater than about $2 \times 10^9$ per square meter, etc.) may be used; distributor plates having a desired thickness (e.g., about 0.125 inches (about 0.316 centimeters), etc.) may be used, distributor plates creating a desired pressure differential there across (e.g., distributor plates creating a pressure differential of about five thousand Pascals for gas flow there across, distributor plates creating a pressure differential of about 23 pounds per square inch of water flow there across, etc.) may be used, etc. Distributor plates configured to support solid materials thereon, while allowing fluids to flow through (e.g., when a desired pressure differential across the distributor plates are achieved, etc.) may be used. It should be appreciated that the pressure differential created by the distributor plates generally depends on the type of fluid passing through the distributor plates.

In addition, distributor plates formed from any suitable material may be used. For example, distributor plates including stainless steel sintered frits, etc. may be used. Further, distributor plates that are substantially the same may be used in the example solid precursor delivery assembly 100. In other example embodiments, however, solid precursor delivery assemblies may include at least one or more distributor plates that are different from at least one or more other distributor plates. As an example, porous metal distributor plates from Mott Corporation (Farmington, Conn.) may be used (e.g., such distributor plates may have liquid permeability coefficients of about 30, gas permeability coefficients of about 260, etc.).

In the illustrated embodiment, the solid precursor delivery assembly 100 includes the three distributor plates 148, 150, and 152 that divide the interior space 136 of the container 102 into the four generally vertically spaced chambers 138, 140, 142, and 144 (and thus generally provide three pressure differentials, or pressure drops within the container 102). In other example embodiments, solid precursor delivery assemblies may include more than or less than three distributor plates and/or may include distributor plates that divide interior spaces of containers into more than or less than four chambers. In still other example embodiments, solid precursor delivery assemblies may include distributor plates that divide interior spaces of containers into horizontally spaced chambers. In still other example embodiments, solid precursor delivery assemblies may include containers in which precursor material is located within more than two chambers (e.g., such that the containers include more than two precursor chambers, for example, three precursor chambers, etc.).

Example operation of the illustrated solid precursor delivery assembly 100 will be described next with continued reference to FIG. 5. To prepare the assembly 100 for operation, precursor material is initially positioned within the first and second precursor chambers 140 and 142 of the container 102. More particularly, precursor material is positioned on an upper portion of the second distributor plate 150 within the first precursor chamber 140 (e.g., via the first fill port 112, etc.), and precursor material is positioned on an upper portion of the third distributor plate 152 within the second precursor chamber 142 (e.g., via the second fill port 114, etc.). The generally fixed positions of the first and second distributor plates 148 and 150 (which generally define the first precursor chamber 140) may provide for a headspace above the precursor material positioned within the first precursor chamber 140. Similarly, the generally fixed positions of the second and third distributor plates 150 and 152 (which generally define the second precursor chamber 142) may provide for a headspace above the precursor material positioned within the second precursor chamber 142.

The solid precursor delivery assembly 100 is generally operated under reduced pressure (e.g., a vacuum is drawn at the outlet 108, etc.). As such, a generally lower pressure region exists toward the outlet 108 (e.g., toward the lower portion of the container 102 in the illustrated embodiment, etc.) and a generally higher pressure region exits toward the inlet 106 (e.g., toward the upper portion of the container 102 in the illustrated embodiment, etc.). As such, carrier gas will generally flow from the upper portion of the container 102 to the lower portion of the container 102 in the illustrated embodiment.

Carrier gas is introduced into the container 102 of the solid precursor delivery assembly 100 through the inlet 106 of the valve assembly 104 (e.g., via selective operation of the valve structure 120, etc.). The carrier gas discharges from the inlet 106 into the inlet chamber 138 of the container 102. The first distributor plate 148 resists flow of the carrier gas from the inlet chamber 138 to the first precursor chamber 140, and the carrier gas generally accumulates and fills the inlet chamber 138. As carrier gas fills the inlet chamber 138, carrier gas pressure therein increases until a sufficient pressure differential exists across the first distributor plate 148 (e.g., carrier gas pressure in the inlet chamber 138 is sufficiently greater than that in the first precursor chamber 140, etc.) to allow the carrier gas to flow through the first distributor plate 148 (e.g., through pore openings of the first distributor plate 148, etc.) and into the first precursor chamber 140.

In the first precursor chamber 140 of the container 102, the second distributor plate 150 resists flow of the carrier gas from the first precursor chamber 140 to the second precursor chamber 142. The carrier gas generally accumulates and fills the first precursor chamber 140 (including the headspace generally above the precursor material on the upper surface of the second distributor plate 150 within the first precursor chamber 140). This allows the carrier gas to pick up (and become at least partially saturated with) vaporized precursor material. Carrier gas (and vaporized precursor material) pressure in the first precursor chamber 140 increases until a sufficient pressure differential exists across the second distributor plate 150 (e.g., pressure in the first precursor chamber 140 is sufficiently greater than that in the second precursor chamber 142, etc.) to allow the carrier gas and vaporized precursor material to flow steadily through the second distributor plate 150 (e.g., through the precursor material on the upper surface of the second distributor plate 150 and then through pore openings of the second distributor plate 150, etc.) and into the second precursor chamber 142. The pressure differential established across the second distributor plate 150 may be the same as or may be different from the pressure differential established across the first distributor plate 148.

In the second precursor chamber 142 of container 102, the third distributor plate 152 resists flow of the carrier gas from the second precursor chamber 142 to the outlet chamber 144. The carrier gas generally accumulates and fills the second precursor chamber 142 (including the headspace generally above the precursor material on the upper surface of the third distributor plate 152 within the second precursor chamber 142). This allows the carrier gas to pick up and top off saturation thereof (e.g., become fully saturated, etc.) with vaporized precursor material from the second precursor chamber 142. Pressure in the second precursor chamber 142 increases until a sufficient pressure differential exists across the third distributor plate 152 (e.g., pressure in the second precursor chamber 142 is sufficiently greater than that in the outlet chamber 144, etc.) to allow the carrier gas saturated with vaporized precursor material to flow steadily through the third distributor plate 152 (e.g., through the precursor material on the upper surface of the third distributor plate 152 and then through pore openings of the third distributor plate 152, etc.) and into the outlet chamber 144. From the outlet chamber 144, the saturated carrier gas (generally saturated with vapor product from the precursor material) exits the container 102 through the outlet 108 (via an opening in the lower portion of the container 102) as desired for subsequent use. The pressure differential established across the third distributor plate 152 may be the same as or may be different from the pressure differential established across the first distributor plate 148 and/or the pressure differential established across the second distributor plate 150.

The illustrated solid precursor delivery assembly 100 generally provides a pathway for carrier gas to flow through the container 102 from the inlet 106 to the inlet chamber 138, through the first distributor plate 148, through the first precursor chamber 140, through the second distributor plate 150, through the second precursor chamber 142, through the third distributor plate 152, and through the outlet chamber 144 to the outlet 108. Other pathways of carrier gas flow through the container 102 may be provided within the scope of the present disclosure.

The multi-chamber configuration of the illustrated solid precursor delivery assembly 100 can help provide consistent saturated carrier gas to the outlet 108 because the carrier gas passes through two chambers (e.g., chambers 140 and 142, etc.) having precursor material before being removed. For example, in the illustrated embodiment the carrier gas initially flows through the first precursor chamber 140 where it picks up a first amount of vaporized precursor material to become at least partially saturated, and then the carrier gas flows through the second precursor chamber 142 where, the carrier gas can pick up additional vaporized precursor material to top off saturation before it is removed through the outlet 108.

In addition, the multi-chamber configuration of the illustrated solid precursor delivery assembly 100 can help provide more efficient and/or complete depletion of precursor material. For example, in the illustrated embodiment a larger quantity of precursor material can be placed in the first precursor chamber 140 than the second precursor chamber 142 to account for diminished saturation requirements of the carrier gas as the carrier gas passes from the first precursor chamber 140 to the second precursor chamber 142. The carrier gas will generally have a lot of volatilized precursor material in it already after leaving the first precursor chamber 140 so that a saturative topping is only required in the second precursor chamber 142. Thus, the bulk of vaporized precursor material in the carrier gas leaving the container 102 (through the outlet 108) will be from the first precursor chamber 140, with less being from the second precursor chamber 142. Since more precursor material will be depleted from the first precursor chamber 140 than from the second precursor chamber 142 (i.e., precursor material in the first precursor chamber 140 will deplete at a generally faster rate than precursor material in the second precursor chamber 142), a larger quantity of precursor material can be placed in the first precursor chamber 140 than in the second precursor chamber 142 so that both chambers 140 and 142 ultimately become depleted at about the same time. For example, the first precursor chamber 140 may be filled with about 75 grams of precursor material and the second precursor chamber 142 may be filled with about 25 grams of precursor material.

In other example embodiments, solid precursor delivery assemblies may include first precursor chambers sized larger than second precursor chambers to accommodate the larger quantities of precursor material that may be placed in the first precursor chambers. For example, solid precursor delivery assemblies may have (but are not limited to) volume ratios of first precursor chambers to second precursor chambers of about 2:1, about 3:1, about 4:1, etc.

Figure 6:
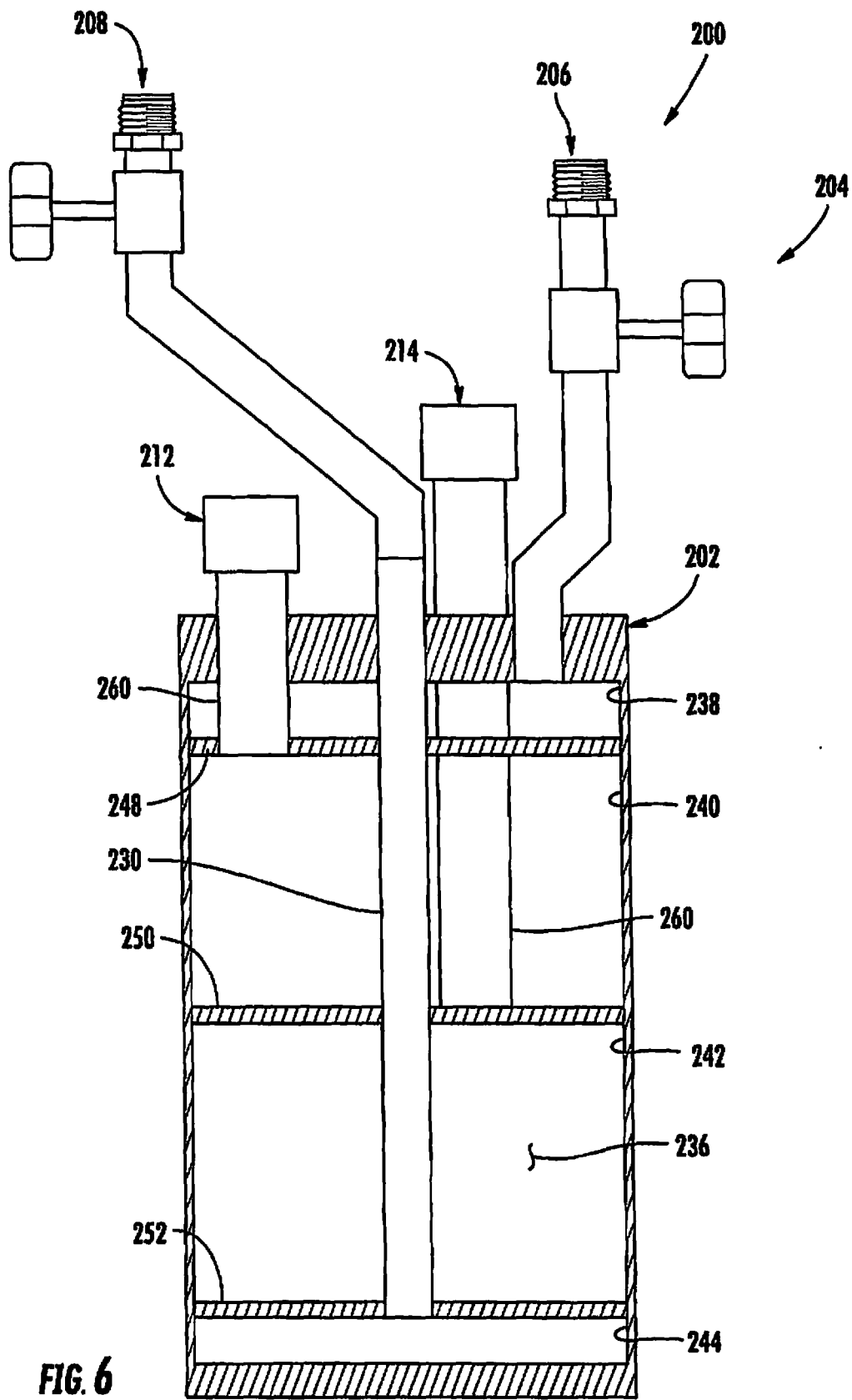
FIG. 6 is an elevation view of another example embodiment of a solid precursor delivery assembly including one or more aspects of the present disclosure with part of a container of the solid precursor delivery assembly broken away to show internal construction.

FIG. 6 illustrates another example embodiment of a solid precursor delivery assembly 200 (e.g., a bubbler assembly, etc.) including one or more aspects of the present disclosure. The example assembly 200 of this embodiment is similar to the solid precursor delivery assembly 100 previously described and illustrated in FIGS. 1-5.

The illustrated solid precursor delivery assembly 200 generally includes a cylindrical container 202 for holding precursor material (and vaporized precursor material), and a valve assembly 204 for controlling, for example, carrier gas flow into the container 202 and vapor product (comprising carrier gas and vaporized precursor material) flow out of the container 202, etc. The container 202 includes a uniform, generally cylindrical interior space 236 defined therein.

The valve assembly 204 of the illustrated solid precursor delivery assembly 200 generally includes an inlet 206 and an outlet 208. The inlet 206 is configured to introduce (or deliver, or dispense, etc.) carrier gas into the container 202. The outlet 208 is configured to transport (or remove) vapor product out of the container 202. In this embodiment, the inlet 206 and the outlet 208 are each coupled to an upper portion of the container 202 by suitable couplings, connections, etc. (e.g., threaded couplings, etc.). The outlet 208 includes an interior tube 230 extending generally through the interior space 236 of the container 202 toward a lower portion of the container 202. As such, the inlet 206 and the outlet 208 are each in fluid communication with the container 202. Carrier gas can thus generally flow through the illustrated container 202 from the inlet 206 to the outlet 208 (from an upper portion of the container 202 to a lower portion of the container 202).

Fill ports 212 and 214 are provided for use in filling and/or refilling the container 202 as necessary, for example, with precursor material. The fill ports 212 and 214 are each coupled to the container 202 by a suitable coupling, connection, etc. such that the fill ports 212 and 214 are each in fluid communication with the container 202. In normal use, the fill ports 212 and 214 may be capped with an appropriate fitting, connector, etc. to help generally seal the container 202 and help ensure that carrier gas flow through the container 202 is from the inlet 206 to the outlet 208 via desired pathways.

The interior space 236 of the container 202 is divided into four chambers 238, 240, 242, and 244 (oriented generally in series) by three porous distributor plates 248, 250, and 252 (broadly, porous dividers). In the illustrated embodiment, the four chambers generally include an inlet chamber 238, first and second precursor chambers 240 and 242, and an outlet chamber 244. The inlet chamber 238 is generally configured to receive carrier gas into the container 202 from the inlet 206 and is located toward the upper portion of the container 202, adjacent where the inlet 206 introduces carrier gas into the container 202. The outlet chamber 244 is generally configured to transition carrier gas (and vaporized precursor materials recovered by the carrier gas) from the container 102 to the outlet 108 and is located toward the lower portion of the container 202, adjacent where the outlet 208 removes carrier gas from the container 202. The first and second precursor chambers 240 and 242 are each configured to hold precursor material within the container 202.

As viewed in FIG. 6, a first distributor plate 248 is located toward an upper portion of the container 202; a second distributor plate 250 is located generally below the first distributor plate 248 toward a middle portion of the container 202; and a third distributor plate 252 is located generally below the second distributor plate 250 toward a lower portion of the container 202. The inlet chamber 238 is defined toward the upper portion of the container 202 generally above the first distributor plate 248; the first precursor chamber 240 is defined generally between the first distributor plate 248 and the second distributor plate 250; the second precursor chamber 242 is defined generally between the second distributor plate 250 and the third distributor plate 252; and the outlet chamber 244 is defined toward the lower portion of the container 202 generally below the third distributor plate 252.

The distributor plates 248, 250, and 252 are each fixedly coupled (and generally sealed) to an interior surface portion of the container 202 so as to inhibit flow of the carrier gas and vapor product around peripheral edges of the distributor plates 248, 250, and 252 (e.g., between the peripheral edges of the distributor plates 248, 250, and 252 and the interior surface portion of the container 202, etc). For example, the distributor plates 248, 250, and 252 may be welded to the interior surface portion of the container 202, mechanically fastened and sealed to the interior surface portion of the container 202, otherwise sealed to the interior surface portion of the container 102, etc. In addition in the illustrated embodiment, the interior tube 230 of the outlet 208 as well as tubes 260 of first and second fill ports 212 and 214 extend into the container 202 generally through openings in the distributor plates 248, 250, and 252. Seals may be provided around the tubes 230 and 260 where they pass through the distributor plates 248, 250, and 252 so as to inhibit undesired flow of the carrier gas and vapor product through the distributor plates 248, 250, and 252 at these locations.

The distributor plates 248, 250, and 252 are each generally configured to create a pressure differential within the container 202 between respective chambers 238, 240, 242, and 244. The distributor plates 248, 250, and 252 accomplish this by generally resisting flow of carrier gas and/or vaporized precursor material therethrough until a desired pressure differential is established. As such, the distributor plates 248, 250, and 252 effectively control flow of the carrier gas and/or vaporized precursor material through the container 202, and can help provide good distribution of carrier gas through the container 202.

It should now be appreciated that example solid precursor delivery assemblies of the present disclosure may provide various improvements, advantages, benefits, etc. over prior assemblies. For example, distributor plates of the example assemblies generally resist flow of carrier gas (and vaporized precursor material recovered by the carrier gas) between chambers of the containers. This provides generally complex flow paths of carrier gas through the containers (e.g., from the inlets, through the distributor plates, and to the outlets, etc.) which increases contact time of the carrier gas with the precursor material within the containers (e.g., within the chambers of the containers, etc.). In addition, this causes the carrier gas to generally fill each of the chambers of the containers (and thus the headspaces above the precursor material) before flowing through respective distributor plates. In turn, this helps to increase carrier gas residence time within each of the chambers (and thus contact time with exposed surfaces of the precursor material within the chambers), homogenize (and/or improve) surface contact of the carrier gas with the precursor material within the chambers, and promote generally uniform flow of the carrier gas through the precursor material. Thus, consistently saturated carrier gas may be provided to the outlets.

Distributor plates of the example solid precursor delivery assemblies also have generally uniform constructions. This can help to provide generally uniform resistance to flow of carrier gas through the distributor plates (e.g., across a surface area of the distributor plates, etc.) and can help to allow the distributor plates to diffuse the carrier gas generally evenly, uniformly, etc. through the precursor material. As a result, undesired channeling and/or maldistribution of carrier gas through the precursor material may be inhibited, and generally uniform depletion of the precursor material may be achieved.

It should also be appreciated that distributor plates of the example solid precursor delivery assemblies (via their resistance to carrier gas and vapor product flow) generate sequential pressure differentials (e.g., pressure drops, etc.) within the containers. For example, relatively high pressure differentials may exits (e.g., about five thousand Pascals, etc.). These pressure differentials, in effect, create a pressure gradient across the container (between the inlet and the outlet), with a generally higher pressure at the inlet and a generally lower pressure at the outlet, and in turn help promote generally uniform flow of the carrier gas over the cross sections of the containers (e.g., generally constant carrier gas mass fluxes transversely through the containers) and through each of the distributor plates. Decreased localized velocities, pressures, etc. of carrier gas (which can cause channeling) may be avoided.

Moreover, it is possible to tailor, configure, select, etc. pressure differentials as desired in the example solid precursor delivery assemblies of the present disclosure to help customize such uniformly distributed flow of the carrier gas through the containers, for example, based on container size, mass of precursor material, type of precursor material, etc. Distributor plates may be selected for use with the solid precursor delivery assemblies so as to provide a desired viscous resistance to the flow of carrier gas and vapor product through the distributor plates, and thus between the chambers.

Further, and as previously described, example solid precursor delivery assemblies of the present disclosure utilize chambered constructions, with precursor material located in each of multiple chambers (e.g., two chambers, etc.). In addition to the benefits previously described, this chambered construction can also provide smaller volumes and smaller headspaces as compared to single chamber containers. The smaller volumes and smaller headspaces fill with carrier gas quicker and can thus allow for reduced residence times of the carrier gas within each of the chambers to achieve ultimate saturation.

Example solid precursor delivery assemblies of the present disclosure may provide a stable, more consistent, saturated vapor of precursor material to a reactor site for a longer period of time (e.g., even as the precursor material becomes depleted, etc.). In addition, because depletion of the precursor material may generally be uniform across a surface area of the precursor material in connection with the illustrated solid precursor delivery assembly, concentration decreases in the vaporized precursor material will occur at later stages of operation, promoting improved usage efficiency of the precursor material. Because most of the vapor product will come uniformly from the precursor material (based on uniform pressure across a surface area of the precursor material), channeling of the precursor material (e.g., at areas of localized decreased pressure, velocity, etc.) may be reduced and/or eliminated. Accordingly, substantially all of the precursor material within the container can be effectively used and delivered to the reactor site. For example, in some embodiments at least about ninety percent or more of the precursor material can be effectively used and delivered to the reactor site at substantially consistent concentrations. In other embodiments at least about ninety-five percent or more of the precursor material can be effectively used and delivered to the reactor site at substantially consistent concentrations.

It should be appreciated that example solid precursor delivery assemblies of the present disclosure may include any desired sizes, configurations, etc. In one example embodiment, a solid precursor delivery assembly includes a generally cylindrical stainless steel container having an outer diameter dimension of the container of about 3.0 inches (about 7.6 centimeters) and an overall height dimension of about 6.15 inches (about 15.6 centimeters). An interior, generally cylindrical space of the container includes a diameter dimension of about 2.8 inches (about 7.1 centimeters) and a height dimension of about 5.1 inches (about 12.9 centimeters), and thus defines a volume of about 31.4 cubic inches (about 515 cubic centimeters). This example assembly also includes three stainless steel sintered discs oriented generally parallel within the stainless steel container and welded to an interior surface portion of the stainless steel container. Each of the stainless steel sintered discs includes a thickness of about 0.125 inches (about 0.316 centimeters), and each includes pores with a nominal pore size of about 0.5 microns. In addition, each of the stainless steel sintered discs configured to create a pressure differential there across (as measured by water flow) of about 23 pounds per square inch. The stainless steel sintered discs define four chambers within the stainless steel container of this example assembly, including an inlet chamber, an outlet chamber, and two precursor chambers. The inlet chamber and the outlet chamber each have a height dimension of about 0.4 inches (about 1.0 centimeters) and each have a volume of about 6.15 cubic inches (about 100.8 cubic centimeters). The first precursor chamber has a height dimension of about 1.94 inches (about 4.9 centimeters) and a volume of about 11.9 cubic inches (about 195 cubic centimeters), and the second precursor chamber has a height dimension of about 1.91 inches (about 4.8 centimeters) and a volume of about 11.8 cubic inches (about 193.4 cubic centimeters).

It should also be appreciated that example solid precursor delivery assemblies of the present disclosure may accommodate any desired mass of precursor material, for example, 350 grams, 850 grams, or any mass other than 350 grams and 850 grams within the scope of the present disclosure.

EXAMPLES

The following examples are merely illustrative, and are not limiting to the disclosure in any way.

Example 1

In one example, the example solid precursor delivery assembly 100 illustrated in FIGS. 1-5 was operated for about one hour with 100 grams of the precursor material trimethylindium (TMI) disposed within each of the first and second precursor chambers 140 and 142. The assembly 100 was maintained at a temperature of about 17 degrees Celsius during operation while a carrier gas was flowed therethrough at a generally constant rate of about 800 standard cubic centimeters per minute. During operation, a generally constant pressure of about 370 Torr existed just before the inlet 106 of the assembly 100, and a generally constant pressure of about 225 Torr was maintained at the outlet 108 of the assembly 100.

The carrier gas (saturated with TMI) leaving the assembly 100 was passed through an ultrasonic concentration measurement system to determine accurately the TMI concentration within the carrier gas. These results are shown in FIG. 7 as Epison amounts/values of TMI over time for the operation of the assembly 100 (one reading was taken every two seconds during operation of the assembly 100). FIG. 7 indicates generally consistent concentration readings of TMI within the carrier gas leaving the assembly 100 over the example prolonged period of operation, highlighting the effectiveness of the given assembly 100 (and output stability).

Example 2

In another example, the example solid precursor delivery assembly 100 illustrated in FIGS. 1-5 was operated for about twenty minutes with 100 grams of the precursor material trimethylindium (TMI) disposed within each of the first and second precursor chambers 140 and 142. The assembly 100 was maintained at a temperature of about 17 degrees Celsius during operation while a carrier gas was flowed therethrough at a generally constant rate of about 800 standard cubic centimeters per minute. During operation, a generally constant pressure of about 370 Torr existed just before the inlet 106 of the assembly 100, and a generally constant pressure of about 225 Torr was maintained at the outlet 108 of the assembly 100.

The carrier gas (saturated with TMI) leaving the assembly 100 was passed through an ultrasonic concentration measurement system to determine accurately the TMI concentration within the carrier gas. These results are shown in FIG. 8 as Epison amounts/values of TMI over time for the operation of the assembly 100 (one reading was taken every two seconds during operation of the assembly 100). FIG. 8 again indicates generally consistent concentration readings of TMI within the carrier gas leaving the assembly 100 over the example prolonged period of operation, highlighting the effectiveness of the given assembly 100 (and output stability).

Specific dimensions disclosed herein are example in nature and do not limit the scope of the present disclosure.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A solid precursor delivery assembly comprising:
   a container;
   at least two chambers defined within the container and configured to hold precursor material within each of the respective at least two chambers;
   at least two porous dividers fixedly coupled to the container and defining at least part of the at least two chambers configured to hold precursor material;
   an inlet coupled to the container for delivering carrier gas into the container; and
   an outlet coupled to the container for removing vapor product from the container comprising vaporized precursor material and carrier gas;
   wherein at least one of the at least two porous dividers is configured to resist flow of carrier gas therethrough to allow a pressure differential of about 0.5 percent to about 50 percent of the average pressure in the chamber upstream of the at least one of the at least two porous dividers to establish across said at least one of the at least two porous dividers.

2. The assembly of claim 1, wherein each of the at least two porous dividers is configured to resist flow of carrier gas therethrough until a pressure differential of about 0.5 percent to about 50 percent of the average pressure in the chamber upstream of said porous divider is established thereacross.

3. The assembly of claim 1, wherein at least one of the porous dividers is a metal frit, and wherein the metal frit is welded to an interior surface of the container.

4. The assembly of claim 1, comprising at least three chambers defined within the container, and at least three porous dividers defining at least part of the at least three chambers.

5. The assembly of claim 1, wherein the at least two chambers include four chambers defined within the container and wherein the at least two porous dividers includes three porous dividers fixedly coupled to the container and defining at least part of the four chambers.

6. The assembly of claim 5, wherein the four chambers include an inlet chamber adjacent where the inlet delivers carrier gas into the container, an outlet chamber adjacent where the outlet removes carrier gas from the container, and first and second precursor chambers disposed between the inlet chamber and the outlet chamber, and wherein the first and second precursor chambers are configured to hold precursor material within the container.

7. The assembly of claim 6, wherein the three porous dividers include a first porous divider disposed between the inlet chamber and the first precursor chamber, a second porous divider disposed between the first precursor chamber and the second precursor chamber, and a third porous divider disposed between the second precursor chamber and the outlet chamber, and wherein the second and third porous dividers are each configured to retain precursor material thereon, and whereby carrier gas flows through the container from the inlet to the inlet chamber, through the first porous divider, through the first precursor chamber, through the second porous divider, through the second precursor chamber, through the third porous divider, and through the outlet chamber to the outlet.

8. The assembly of claim 1, wherein the container includes an upper portion, the inlet being coupled to the upper portion of the container.

9. The assembly of claim 8, wherein the container includes a lower portion, the outlet being coupled to the lower portion of the container.

10. The assembly of claim 9, wherein the outlet includes a tube disposed generally outside the container and extending along at least part of a length of the container, the tube coupling the outlet to the lower portion of the container.

11. The assembly of claim 1, further including at least two fill ports for use in filling and/or refilling the container with precursor material.

12. The assembly of claim 1, wherein the precursor material is trimethylindium.

13. The assembly of claim 1, wherein the at least two chambers include a first precursor chamber and a second precursor chamber each configured to hold precursor material therein, and wherein a volume of the first precursor chamber is greater than a volume of the second precursor chamber.

14. The assembly of claim 1, wherein the at least two porous dividers have pore sizes of less than 25 microns.

15. A solid precursor delivery assembly comprising:
    a container having upper and lower portions;
    four chambers defined within the container including an inlet chamber, an outlet chamber, and first and second precursor chambers, the first and second precursor chambers configured for holding precursor material within the container;
    three sintered frits fixedly coupled and sealed to an interior portion of the container, the three sintered frits defining at least part of the four chambers within the container, at least one of the sintered frits configured for retaining precursor material thereon within the first precursor chamber, and at least one of the sintered frits configured for retaining precursor material thereon within the second precursor chamber;
    an inlet coupled to the upper portion of the container for delivering carrier gas into the container; and
    an outlet coupled to the lower portion of the container for use in removing vapor product from the container comprising vaporized precursor material and carrier gas;
    wherein a volume of the first precursor chamber is greater than a volume of the second precursor chamber.

16. The assembly of claim 15, wherein the three sintered frits are each configured to resist flow of carrier gas through the sintered frits until a desired pressure differential is established thereacross.

17. The assembly of claim 15, wherein the outlet includes a tube disposed generally outside the container and extending along at least part of a length of the container, the tube coupling the outlet to the lower portion of the container.

18. The assembly of claim 15, wherein the container is a metal container, and wherein each of the three sintered frits are welded to an interior portion of the metal container.

19. The assembly of claim 15, wherein each of the three sintered frits includes pore sizes of less than 25 microns.

20. A method of recovering vaporized precursor material with a carrier gas in a multi-chamber solid precursor delivery assembly, the method comprising:

delivering carrier gas to a multi-chamber solid precursor delivery assembly;

retaining carrier gas within headspace of a first precursor chamber of the multi-chamber solid precursor delivery assembly generally above precursor material disposed within the first precursor chamber until a pressure differential of about 0.5 percent to about 50 percent of the average pressure in the first precursor chamber exists across a first sintered frit of the multi-chamber solid precursor delivery assembly separating the first precursor chamber from a second precursor chamber, at which time the carrier gas and vaporized precursor material recovered by the carrier gas flows through the first sintered frit to the second precursor chamber;

retaining the carrier gas within headspace of the second precursor chamber of the multi-chamber solid precursor delivery assembly generally above precursor material disposed within the second precursor chamber until a pressure differential of about 0.5 percent to about 50 percent of the average pressure in the second precursor chamber exists across a second sintered frit of the multi-chamber solid precursor delivery assembly separating the second precursor chamber from a third chamber, at which time the carrier gas and vaporized precursor material recovered by the carrier gas flows through the second sintered frit to the third chamber; and removing the carrier gas and vaporized precursor material recovered by the carrier gas from the multi-chamber solid precursor delivery assembly.

21. The method of claim 20, wherein the third chamber is an outlet chamber.

\* \* \* \* \*